(12) United States Patent
Clavette et al.

(10) Patent No.: US 11,147,165 B2
(45) Date of Patent: *Oct. 12, 2021

(54) ELECTRONIC SYSTEM AND INTERPOSER HAVING AN EMBEDDED POWER DEVICE MODULE

(71) Applicant: Infineon Technologies Austria AG, Villach (AT)

(72) Inventors: Danny Clavette, Greene, RI (US); Darryl Galipeau, Warwick, RI (US)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/655,306

(22) Filed: Oct. 17, 2019

(65) Prior Publication Data

US 2021/0120676 A1    Apr. 22, 2021

(51) Int. Cl.
| | | |
|---|---|---|
| *H05K 1/14* | (2006.01) | |
| *H05K 1/18* | (2006.01) | |
| *H05K 1/05* | (2006.01) | |
| *H05K 1/16* | (2006.01) | |

(52) U.S. Cl.
CPC .............. *H05K 1/188* (2013.01); *H05K 1/05* (2013.01); *H05K 1/162* (2013.01); *H05K 1/165* (2013.01); *H05K 2201/0221* (2013.01)

(58) Field of Classification Search
CPC ........... H05K 1/056; H05K 1/181–188; H05K 1/14–145; H05K 1/162; H05K 1/165
See application file for complete search history.

(56) References Cited

U.S. PATENT DOCUMENTS

| | | |
|---|---|---|
| 10,128,035 B2 | 11/2018 | Yao et al. |
| 10,367,415 B1 | 7/2019 | Sturcken et al. |
| 2003/0128017 A1 | 7/2003 | Kumar et al. |
| 2004/0188811 A1 | 9/2004 | Vandentop et al. |
| 2005/0207133 A1* | 9/2005 | Pavier ................ H01L 24/82 361/761 |
| 2007/0013080 A1* | 1/2007 | DiBene ............ H01L 25/0657 257/777 |
| 2007/0249092 A1 | 10/2007 | Joshi et al. |
| 2007/0279882 A1* | 12/2007 | Weir .................. H01L 23/66 361/794 |
| 2010/0188184 A1 | 7/2010 | Chen |

(Continued)

FOREIGN PATENT DOCUMENTS

EP      3007223      4/2016

*Primary Examiner* — Hoa C Nguyen
(74) *Attorney, Agent, or Firm* — Murphy, Bilak & Homiller, PLLC

(57) ABSTRACT

An interposer for a processor includes: an electrically insulating material having a first main side and a second main side opposite the first main side; a plurality of electrically conductive structures embedded in the electrically insulating material and configured to provide an electrical interface for a processor substrate at the first main side of the electrically insulating material and to provide electrical connections from the electrical interface to the second main side of the electrically insulating material; and a power device module embedded in the electrically insulating material and configured to convert a voltage provided at the second main side of the electrically insulating material to a lower voltage at the first main side of the electrically insulating material.

21 Claims, 8 Drawing Sheets

(56) References Cited

U.S. PATENT DOCUMENTS

| | | |
|---|---|---|
| 2011/0234196 A1 | 9/2011 | Chiba |
| 2013/0075932 A1* | 3/2013 | Schwarzer ........ H01L 23/49827 |
| | | 257/774 |
| 2014/0367828 A1 | 12/2014 | Colonna et al. |
| 2015/0049533 A1* | 2/2015 | Nishikimi .......... H05K 7/20127 |
| | | 363/141 |
| 2015/0171065 A1 | 6/2015 | Guzek et al. |
| 2015/0380061 A1 | 12/2015 | Matsumoto et al. |
| 2016/0128197 A1 | 5/2016 | Standing et al. |
| 2016/0349288 A1 | 12/2016 | Barnette et al. |
| 2016/0351478 A1* | 12/2016 | Lai ...................... H01L 23/3114 |
| 2016/0365304 A1 | 12/2016 | Cho et al. |
| 2016/0381823 A1* | 12/2016 | Ye .......................... H05K 1/181 |
| | | 361/736 |
| 2017/0237339 A1* | 8/2017 | Young .................... H02M 7/10 |
| | | 363/126 |
| 2017/0302151 A1 | 10/2017 | Snook et al. |
| 2019/0273073 A1 | 9/2019 | Murtuza et al. |
| 2020/0075541 A1 | 3/2020 | Sturcken et al. |

\* cited by examiner

ELECTRONIC SYSTEM AND INTERPOSER HAVING AN EMBEDDED POWER DEVICE MODULE

BACKGROUND

Many types of electronic systems include one or more processors attached to a circuit board such as a printed circuit board (PCB), memory which can be volatile and/or non-volatile, and a power converter for converting a high input voltage applied to the board to one or more lower voltages suitable for powering the processor and memory. Processors include but are not limited to central processing units (CPUs), microprocessors, graphics processing units (GPUs), digital signal processors (DSPs), image processors, network or packet processors, coprocessors, multi-core processors, front-end processors, baseband processors, etc.

Ideally, power is conveyed across the circuit board of the electronic system from the power converter to the processor and memory with as high a voltage as possible to minimize current and therefore reduce $I^2R$ power losses. However, processors are typically placed on a separate substrate through which connections between the processor and the circuit board are achieved. Many types of processor substrates are designed with minimum capacitance between layers to enable high performance, e.g., in the GHz range. Processor substrates constructed from low dielectric constant materials have a low breakdown voltage. As such, many types of conventional processor substrates cannot tolerate relatively high voltages. For example, some conventional processor substrates have a maximum breakdown voltage of 2.5 V or even lower, whereas the input voltage to the circuit board of an electronic system is much higher, e.g., typically 48 V.

Thus, there is a need for an improved power distribution interface for a processor substrate which can withstand higher voltages so that power may be conveyed across a circuit board of an electronic system with a higher voltage and lower current to reduce $I^2R$ power losses.

SUMMARY

According to an embodiment of an electronic system, the electronic system comprises: a board; a power converter attached to the board and configured to convert an input voltage applied to the board to an intermediate voltage; a processor attached to a substrate; and an interposer through which the processor attached to the substrate is in electrical communication with the board, wherein the interposer comprises: an electrically insulating material having a first main side facing the substrate and a second main side facing the board; a plurality of electrically conductive structures embedded in the electrically insulating material and configured to provide an electrical interface between the substrate and the board, or between the substrate and a socket attached to the board and in which the interposer is seated; and a power device module embedded in the electrically insulating material and configured to convert the intermediate voltage to a voltage that is within an operating range of the processor.

According to an embodiment of a processor interposer, the processor interposer comprises: an electrically insulating material having a first main side and a second main side opposite the first main side; a plurality of electrically conductive structures embedded in the electrically insulating material and configured to provide an electrical interface for a processor substrate at the first main side of the electrically insulating material and to provide electrical connections from the electrical interface to the second main side of the electrically insulating material; and a power device module embedded in the electrically insulating material and configured to convert a voltage provided at the second main side of the electrically insulating material to a lower voltage at the first main side of the electrically insulating material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described provide a processor interposer configured to provide an electrical interface for a processor substrate and in which a power device module is embedded in an electrically insulating material of the processor interposer. The power device module is configured to convert a voltage provided at a front or back side of the electrically insulating material to a lower voltage at the opposite side of the electrically insulating material. With such a processor interposer, power may be conveyed across a circuit board of an electronic system with a higher voltage and lower current to reduce $I^2R$ power losses and without jeopardizing the integrity of the processor substrate.

The term "power device module" as used herein means a packaged functional assembly that includes at least one power switch used in converting a voltage from one level to another level, e.g., as is done in power conversion and voltage regulation. The power device module may also include a driver circuit for driving the at least one power switch. The power device module may additionally include a controller for controlling the driver circuit so as to implement a power converter or a voltage regulator (VR). The controller and/or driver functionality may instead be implemented outside the power device module. For example, a processor attached to a substrate which in turn is attached the processor interposer in which the power device module is embedded may provide the VR control functionality to the power device module, thereby eliminating the need for a separate VR controller. The driver circuit for the at least one power switch included in the power device module also may be outside the power device module. Various passive components such as capacitors and/or inductors that make up the power converter or voltage regulator may be included in the power device module, surface mounted to the power device module, located on a separate board, etc. Described next in more detail are various embodiments of the processor interposed with an embedded power device module and an electronic system that uses such a processor interposer.

Figure 1:
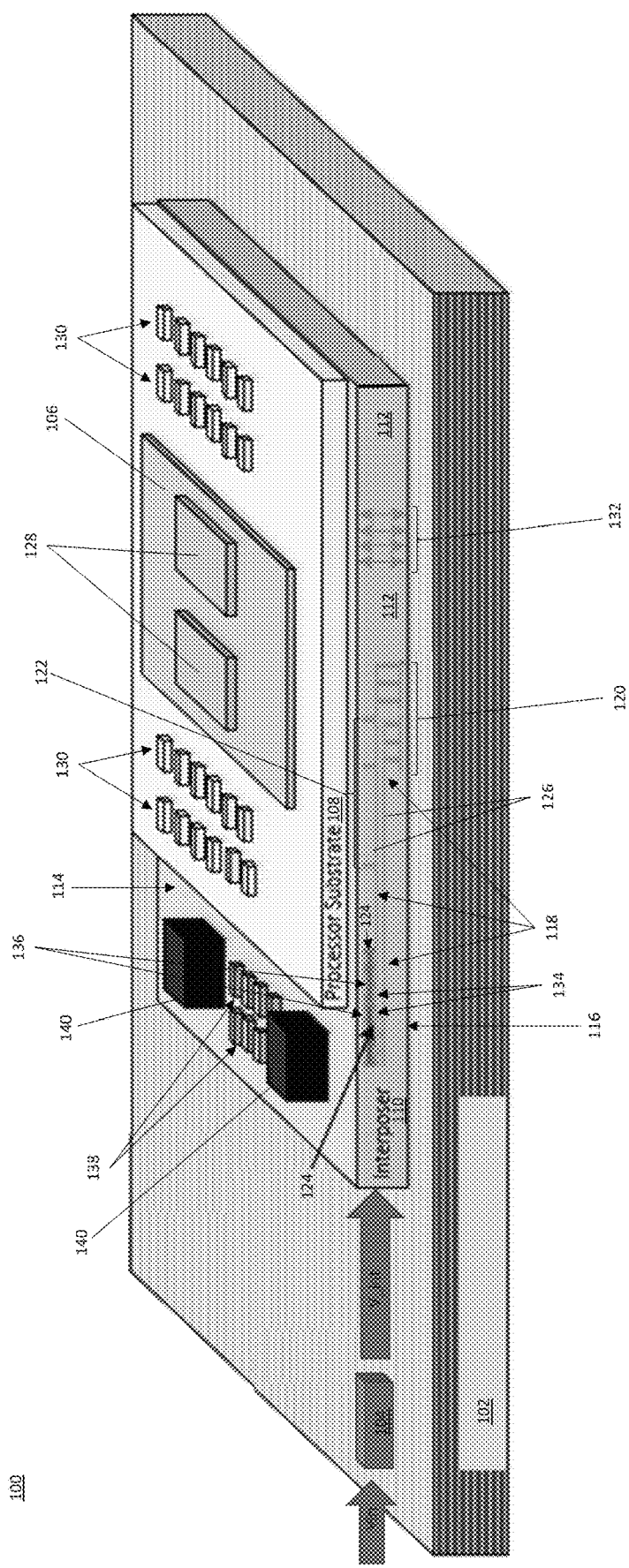
FIG. 1 illustrates a side perspective view of an embodiment of an electronic system that includes a system board, a power converter attached to the system board, a processor attached to a substrate, and a processor interposer with at least one embedded power device module.

FIG. 1 illustrates an embodiment of an electronic system 100 that includes a system board 102 such as a PCB, a power converter 104 attached to the system board 102, and a processor 106 attached to a processor substrate 108. The processor 106 is in electrical communication with the system board 102 through a processor interposer 110. The processor interposer 110 may be a laminate such as a PCB, an organic substrate, a ceramic substrate, etc. In each case, the processor interposer 110 includes an electrically insulating material 112 such as FR4, a ceramic, an organic dielectric, etc. having a first main side 114 facing the processor substrate 108 and a second main side 116 facing the system board 102. Electrically conductive structures 118 embedded in the electrically insulating material 112 of the processor interposer 110 provide an electrical interface between the processor substrate 108 and the system board 102. The electrical interface includes a power input 120 for receiving power from the power converter 104 attached to the system board 102 and a power output 122 for delivering power to the processor 106 attached to the processor substrate 108.

The term "processor" as used herein means an electronic circuit which performs operations on an external data source such as memory or some other data stream. The term "processor" as used herein includes CPUs, microprocessors, GPUs, DSPs, artificial intelligence (AI) accelerators, image processors, network or packet processors, coprocessors, multi-core processors, front-end processors, baseband processors, etc. The type of processor 106 depends on the electronic system 100. For example, in the case of a computer, server, mobile device, etc., the processor 106 may be a CPU, a microprocessor, a coprocessor, a multi-core processor, a front-end processor, etc. In the case of a network interface that manages radio functions of a wireless network, the processor 106 may be a baseband processor. In the case of a graphics card, the processor 106 may be a GPU or an image processor. In the case of a network interface card, the processor 106 may be a network or packet processor. These are just some examples of electronic systems and should not be considered limiting.

In each case, the power converter 104 attached to the board 102 of the electronic system 100 is configured to convert an input voltage Vin applied to the system board 102 to an intermediate voltage V_int lower than the input voltage Vin and which is carried by the system board 102 to the power input 120 of the processor interposer 110. For example, the input voltage Vin applied to the system board 102 may be 48V or 12V and the intermediate voltage V_int output by the power converter 104 may be 6V. These input and intermediate voltage values are only given as an example and should not be considered limiting. What does matter is that both the input voltage Vin applied to the system board 102 and the intermediate voltage V_int output by the power converter 104 are higher than the operating voltage range of the processor 106 any may be higher than a voltage limit such as a breakdown voltage of the processor substrate 108 and. Accordingly, power may be conveyed across the system board 102 at a higher voltage (V_int) and lower current to reduce $I^2R$ power losses.

By setting the intermediate voltage V_int output by the power converter 104 attached to the system board 102 above the voltage limit of the processor 106, the $I^2R$ power loss between the power converter 104 and the processor interposer 110 is reduced substantially. Instead of outputting the processor supply voltage, e.g., 1V, the intermediate voltage V_int output by the power converter 104 is instead higher, e.g., 6V. In this example, which should not be considered limiting, the current carried by the system board 102 between the power converter 104 and the processor interposer 110 is reduced by a factor of 6 and the $I^2R$ power loss reduced by 36X. More or less $I^2R$ power loss reduction may be realized by selecting an appropriate level of the power converter output V_int.

To ensure the processor substrate 108, in particular the insulating material 112 it contains, is not damaged by the voltage V_int output by the power converter 108, at least one power device module 124 is embedded in the processor interposer 110, as shown by the partial cross-sectional view of the processor interposer 110 in FIG. 1. Each power device module 124 embedded in the processor interposer 110 converts the intermediate voltage V_int at the power input 120 at the bottom side 116 of the processor interposer 110 to a lower voltage at the top side 114 of the processor interposer 110, e.g., to a voltage that is within the operating range of the processor 106 and which may or may not below the voltage limit of the processor substrate 108. The reduced voltage output by each power device module 124 is provided at the power output 122 at the top side 114 of the processor interposer 110. More than one power device module 124 may be embedded in the processor interposer 110 as shown in FIG. 1, e.g., in the case of a multi-phase voltage regulator where each power device module 124 implements one phase of the voltage regulator. A single power device module 124 instead may be embedded in the processor interposer 110, e.g., in the case of a single-phase voltage regulator.

Standard substrate processing may be used to embed each power device module 124 in the processor interposer 110. For example, the processor interposer 110 may be a laminate substrate with one or more layers of dielectric material as the electrically insulating material 112 and one or more layers of metal traces, electrically conductive vias, etc. which form the electrically conductive structures 118. Each power device module 124 may be placed in or surrounded by a first layer of the dielectric material 112, e.g., by depositing or growing the dielectric material 112 of the processor interposer 110 around the power device module 124. The upper layer(s) of the dielectric material 112 of the processor interposer 110 are then manufactured, e.g., according to a known process. In one embodiment, the electrically insulating material 112 of the processor interposer 110 is an organic material having a relatively low dielectric constant compared to other typical laminate materials such as FR4.

The electrically conductive structures 118 of the processor interposer 110 include a power input 120 which receives the intermediate voltage V_int at the second main side 116 of the processor interposer 110 and a power output 122 which delivers the reduced voltage output by each power device module 124 to the processor substrate 108 at the first main side 114 of the processor interposer 110, as previously described herein. The electrically conductive structures 118 embedded in the electrically insulating material 112 of the processor interposer 110 includes first distribution circuitry 126 such as metal traces, metal wires, metal vias, etc., for carrying the intermediate voltage V_int at the power input 120 of the processor interposer 110 to each power device module 124 embedded in the processor interposer 110. The electrically conductive structures 118 embedded in the electrically insulating material 112 of the processor interposer 110 further include second distribution circuitry (out of view) such as metal traces, metal wires, metal vias, etc., for carrying the voltage output by each power device module 124 embedded in the processor interposer 110 to the power output 122 at the first main side 114 of the electrically insulating material 112 for delivery to the processor substrate 108. The distribution circuitry 126 may be realized as part of a standard metallization process employed in the fabrication of interposer substrates.

Memory 128 and other components such as decoupling capacitors 130, etc. also may be attached to the processor substrate 108 and/or to the processor 106. High frequency signals such as GHz signals may pass through signal I/Os of the processor 106 and/or memory 128, the signal I/Os being out of view in FIG. 1. The processor interposer 110 includes additional electrically conductive structures 132 such as metal traces, metal wires, metal vias, etc., for carrying I/O signals between the processor substrate 108 and the system board 102. The system board 102 may include a large number of high frequency memory I/O signal lines (not shown) for routing the I/O signals on and off the system board 102. Such an arrangement restricts power delivery flow on the system board 102 and complicates the delivery of power to the processor 106 and memory 128 due to various board parasitics.

Further complicating power delivery to the processor 106, the processor substrate 108, processor 106 and memory 128 each have voltage limitations which should not be exceeded. By embedding at least one power device module 124 in the electrically insulating material 112 of the processor interposer 110, the power converter 104 attached to the system board 102 can convert the input voltage Vin applied to the system board 102 to an intermediate voltage V_int that is higher than the voltage limitations of at least the processor substrate 108 and the processor 106, and each power device module 124 embedded in the processor interposer 110 converts the intermediate voltage V_int at the second main side 116 of the processor interposer 110 to a safe voltage level at the first main side 114 of the processor interposer 110 that is within the operating range of the processor 106 and which may or may not be below the voltage limit of the processor substrate 106.

Each power device module 124 embedded in the processor interposer 110 has at least one power contact 134 at the bottom side of the power device module 124 for receiving the intermediate voltage V_int from the first distribution circuitry 126 embedded in the electrically insulating material 112 of the processor interposer 110. Likewise, each power device module 124 embedded in the processor interposer 110 also has at least one power contact 136 at the top side of the power device module 124 for providing the reduced voltage output by the power device module 124 to the second distribution circuitry (out of view) embedded in the electrically insulating material 112 of the processor interposer 110.

As shown in FIG. 1, the distribution circuitry 126 embedded in the electrically insulating material 112 of the processor interposer 110 may run laterally. In this case, one or more capacitors 138 and one or more inductors 140 electrically connected to each power device module 124 embedded in the processor interposer 110 may be attached to the first main side 114 of the electrically insulating material 112 of the processor interposer 110 outside the footprint for the processor substrate 108, and each power device module 124 embedded in the processor interposer 110 may at least partially vertically overlap with the one or more capacitors 138 and/or the one or more inductors 140. Two inductors 140 and two sets of capacitors 138 are shown in FIG. 1 as an example of a 2-phase power converter/voltage regulator having two power device modules 124. In general, an n-phase power converter or voltage regulator may be implemented where n is a positive integer greater than or equal to 1.

Figure 2:
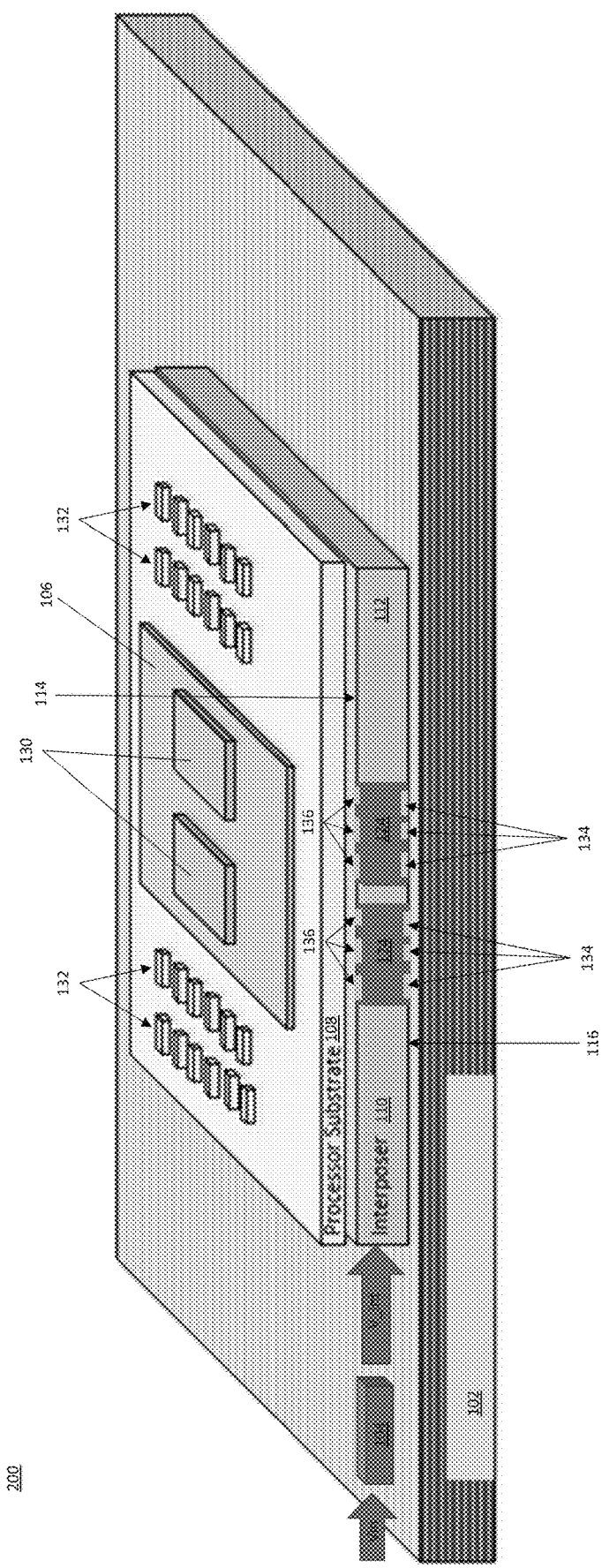
FIG. 2 illustrates a side perspective view of another embodiment of an electronic system that includes a system board, a power converter attached to the system board, a processor attached to a substrate, and a processor interposer with at least one embedded power device module.

FIG. 2 illustrates another embodiment of an electronic system 200 that includes a system board 102 such as a PCB, a power converter 104 attached to the system board 102, a processor 106 attached to a processor substrate 108, and an processor interposer 110 having at least one embedded power device module 124 and through which the processor 106 is in electrical communication with the system board 102. The embodiment illustrated in FIG. 2 is similar to the embodiment illustrated in FIG. 1. Different, however, each power device module 124 embedded in the processor interposer 110 contains the necessary passive elements such as capacitors and inductors, and is vertically aligned with the processer 106 and a primary current path between the system board 102, the processor interposer 110, the processor substrate 108 and the processor 106 is a vertical path which includes the power device module 114.

Figure 3:
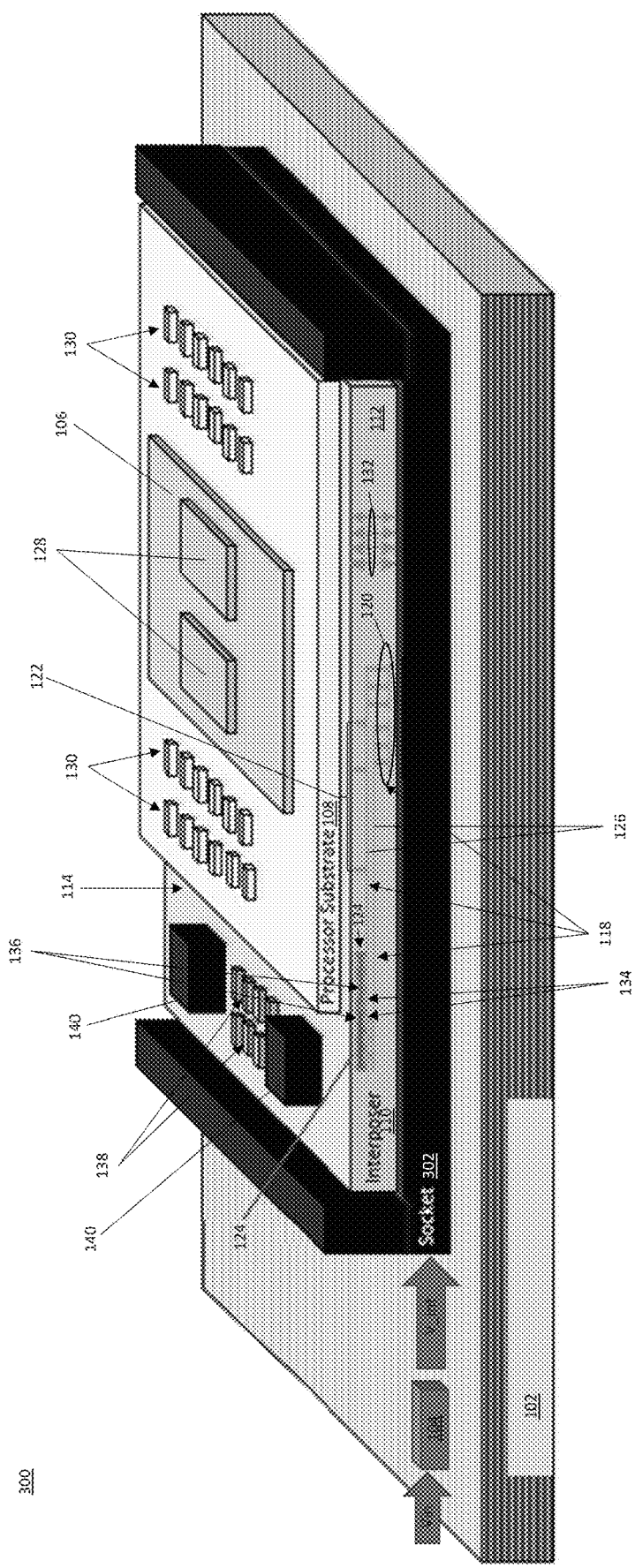
FIG. 3 illustrates a side perspective view of another embodiment of an electronic system that includes a system board, a power converter attached to the system board, a processor attached to a substrate, and a processor interposer with at least one embedded power device module.

FIG. 3 illustrates another embodiment of an electronic system 300 that includes a system board 102 such as a PCB, a power converter 104 attached to the system board 102, a processor 106 attached to a processor substrate 108, and an processor interposer 110 having at least one embedded power device module 124 and through which the processor 106 is in electrical communication with the system board 102. The embodiment illustrated in FIG. 3 is similar to the embodiment illustrated in FIG. 1. Different, however, a socket 302 is attached to the system board 102 and the processor interposer 110 is seated in the socket 302. According to this embodiment, the electrically conductive structures 118 embedded in the electrically insulating material 112 of the processor interposer 110 provide an electrical interface between the processor substrate 108 and the socket 302 in which the processor interposer 110 is seated. The socket 302 may be a pin grid array (PGA) socket, a land grid array (LGA) socket, etc. The socket 302 may have a retention clip (not shown) for applying a constant force which must be overcome when the interposer 110 with the processor substrate 108 attached thereto are inserted in the socket 302. The socket 302 may be a zero-insertion force (ZIF) socket.

Figure 4:
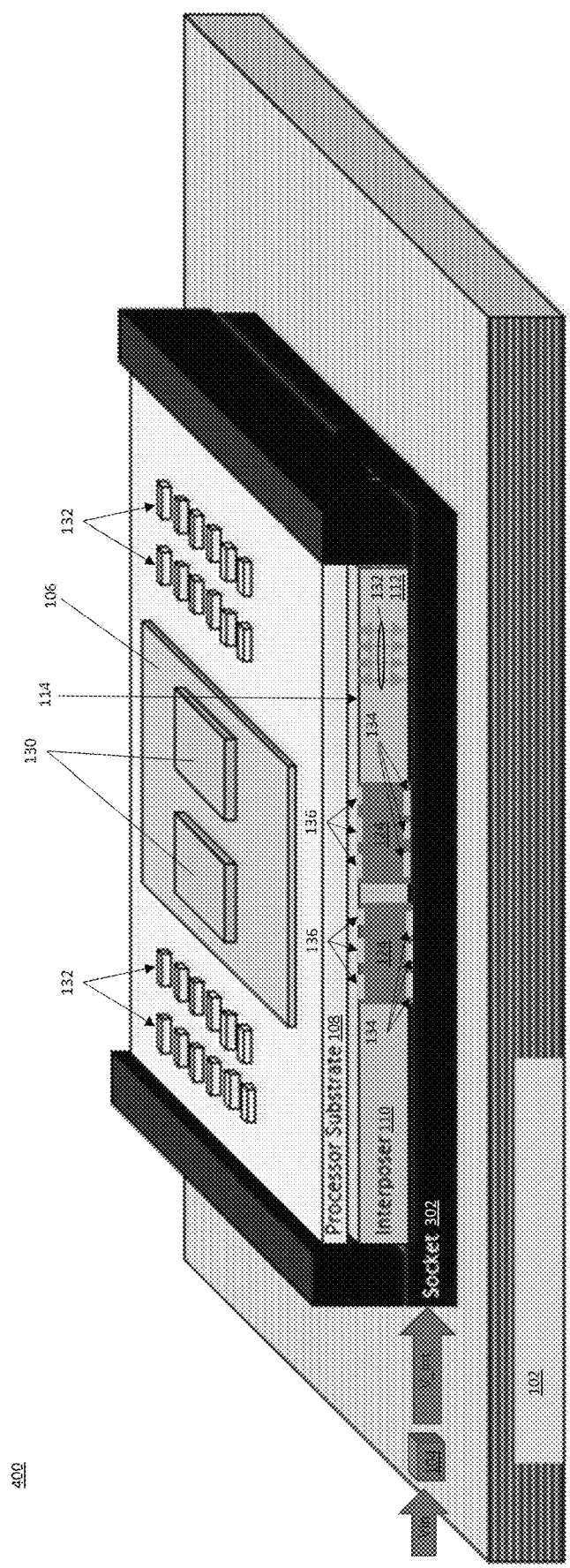
FIG. 4 illustrates a side perspective view of another embodiment of an electronic system that includes a system board, a power converter attached to the system board, a processor attached to a substrate, and a processor interposer with at least one embedded power device module.

FIG. 4 illustrates another embodiment of an electronic system 400 that includes a system board 102 such as a PCB, a power converter 104 attached to the system board 102, a processor 106 attached to a processor substrate 108, and an processor interposer 110 having at least one embedded power device module 124 and through which the processor 106 is in electrical communication with the system board 102. The embodiment illustrated in FIG. 4 is similar to the embodiment illustrated in FIG. 2. Different, however, a socket 302 is attached to the system board 102 and the processor interposer 110 is seated in the socket 302. The socket 302 may be of the kind previously described herein in connection with FIG. 3.

According the embodiment illustrated in FIG. 4, the electrically conductive structures 118 embedded in the electrically insulating material 112 of the processor interposer 110 provide an electrical interface between the processor substrate 108 and the socket 302 in which the processor interposer 110 is seated. According to the embodiments illustrated in both FIG. 3 and FIG. 4, the footprint of the processor interposer 110 with the embedded power device module 124 embedded thereon may be the same as the footprint for the processor substrate 108.

Described next are additional power device module embodiments, any of which may be used in the electronic systems 100-400 shown in FIGS. 1 through 4, respectively, or in other types of electronic systems that have at least one processor mounted to a system board and wherein the input voltage to the system board is higher than the voltage limits of the processor and processor substrate.

Figure 5:
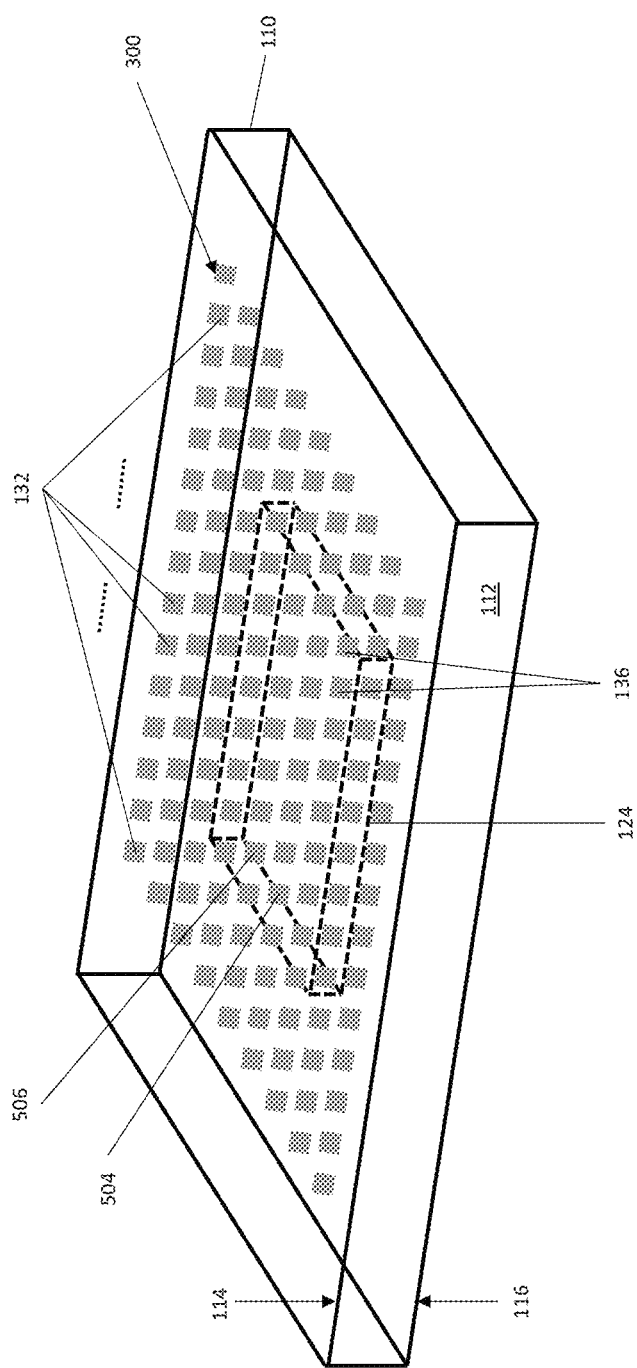
FIG. 5 illustrates a side perspective view of an embodiment of a single power device module embedded in a processor interposer.

FIG. 5 illustrates a side perspective view of a single power device module 124 embedded in a processor interposer 110. The power device module 124 is shown as a dashed box in FIG. 5 to indicate that the power device module 124 is embedded within the electrically insulating material 112 of the processor interposer 110.

As previously described herein, electrically conductive structures embedded in the electrically insulating material 112 of the processor interposer 110 provide an electrical interface between a processor substrate and a system board if the processor interposer 110 is attached to the system board, or between the processor substrate and a socket attached to the system board if the processor substrate is seated in the socket. The interface is partly visible in FIG. 5 as terminals 500 such as metal traces, contact pads, pins, solder bumps, Cu pillars, etc., at the first main side 114 of the processor interposer 110. The terminals 500 at the first main side 114 of the processor interposer 110 may include the one or more power contacts 136 which form the power output 122 for delivering power to the processor substrate 108. The terminals 500 at the first main side 114 of the processor interposer 110 may also include I/O contacts 502 for carrying I/O signals between the processor substrate 108 and the processor interposer 110. The processor mounted to the processor interposer 110 has corresponding terminals at a mounting side of the processor, for connecting to the terminals 500 at the first main side 114 of the processor interposer 110.

A similar interface, which is out of view in FIG. 5, is provided at the second main side 116 of the processor interposer 110 for receiving power from the system board and for carrying I/O signals between the processor interposer 110 and the system board. The processor interposer 110 may be attached to the system board, e.g., as previously described herein in connection with FIGS. 1 and 2, or instead may be seated in a socket which in turn is attached to the system board, e.g., as previously described herein in connection with FIGS. 3 and 4. The processor, processor substrate, system board and socket are not shown in FIG. 3 for ease of illustration.

In one embodiment, the driver circuit for the at least one at least one power switch included in the power device module 124 also is embedded in the processor interposer 110 and the electrical interface provided by the processor interposer 110 includes a terminal 504 for receiving a switching control signal from the processor for controlling the driver circuit included in the power device module 124, and one or more additional terminals 506 for providing telemetry data such a current information, temperature information, etc. from the power device module 124 to the processor. According to this embodiment, the processor attached to the processor interposer 110 in which the power device module 124 is embedded provides the power conversion or voltage regulation control functionality to the power device module 124, thereby eliminating the need for a separate controller.

Figure 6:
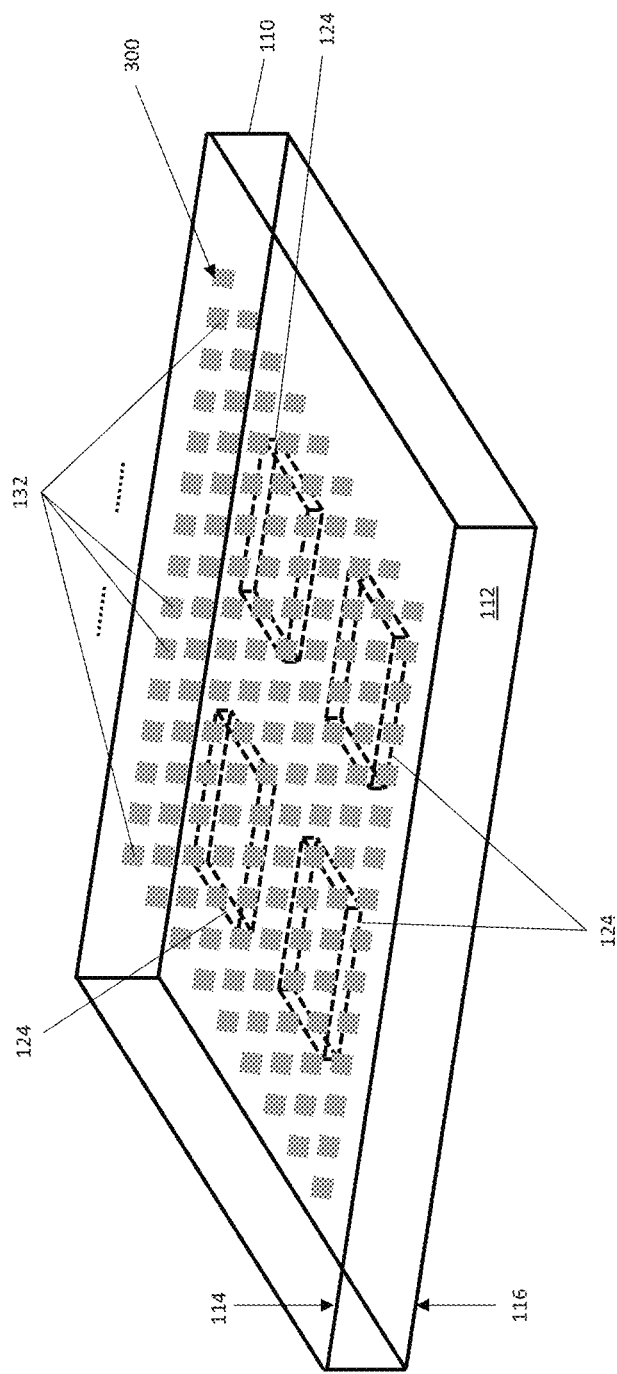
FIG. 6 illustrates a side perspective view of an embodiment of multiple power device modules embedded in a processor interposer.

FIG. 6 illustrates a side perspective view of multiple power device modules 124 embedded in the same processor interposer 110, according to an embodiment. In this embodiment, the power device modules 124 are shown as individual dashed boxes in FIG. 6 to indicate that the power device modules 124 are each embedded within the electrically insulating material 112 of the processor interposer 110. The embodiment shown in FIG. 6 is similar to the embodiment shown in FIG. 5. Different, however, more than one power device module 124 is embedded in the processor interposer 110. Each power device module 124 may be a separate power stage of a power converter or voltage regulator, or each power device module 124 may be a complete power converter or voltage regulator so that multiple power converters or voltage regulators are embedded in the same processor interposer 110. Multiple power converters or voltage regulators embedded in the same processor interposer 110 may be of particular interest if more than one processor is attached to the same processor interposer 110 and/or if one or memory modules with a different operating voltage range than the processor(s) are also attached to the processor interposer 110.

As previously described herein, each power device module 124 is a packaged functional assembly that includes at least one power switch used in converting the intermediate voltage V_int output by the power converter 104 attached to the system board 102 to a voltage that is within the operating range of the processor 106 and which may or may not be below the voltage limit of the processor substrate 108. Each power device module 124 is packaged in that the module 124 has an enclosure such as a molded plastic or resin body, laminate structure, etc. in which at least one power switch is embedded or enclosed. The power device module 124 may also include a driver circuit for driving the at least one power switch. The power device module 124 may additionally include a controller for controlling the driver circuit so as to implement a power converter or a voltage regulator (VR). The controller and/or driver functionality may instead be implemented outside the power device module 124. In each case, the power converter or voltage regulator at least partly implemented by the power device module 124 may be any typical power converter or voltage regulator used to supply power to a processor on a system board. For example, the power converter or voltage regulator may be a buck converter, a boost converter, a buck-boost converter, a switched capacitor voltage regulator, etc. Described next in more detail are various embodiments of the power device module 124.

Figure 7:
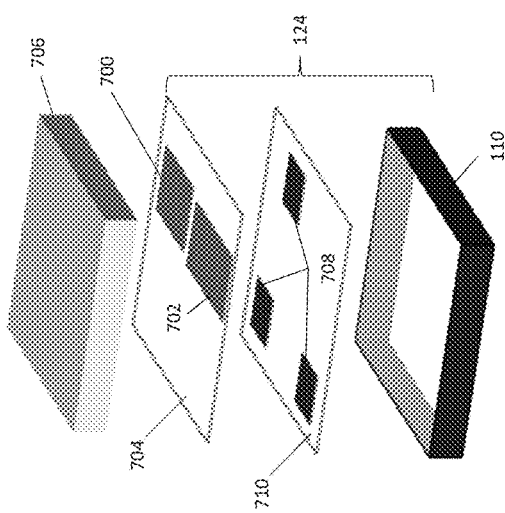

FIG. 7 shows an exploded side perspective view of the power device module 124 embedded in the processor interposer 110, according to another embodiment. In this embodiment, the power device module 124 implements a single phase of a power converter or voltage regulator that converts the intermediate voltage V_int output by the power converter 104 attached to the system board 102 to a voltage that is within the operating range of the processor 106 and which may or may not be below the voltage limit of the processor substrate 108. The single phase includes a high-side power transistor chip (die) 700 and a low-side power transistor chip 702 embedded in a layer 704 of the electrically insulating material 112 of the processor interposer 110. The high-side and low-side power transistor chips 700, 702 are shown as being formed in the same layer 704 of the electrically insulating material 112 of the processor interposer 110 in FIG. 7. However, the high-side and low-side power transistor chips 700, 702 instead may be formed in different layers of the electrically insulating material 112 of the processor interposer 110, which also applies to the other power device module embodiments shown in FIGS. 8, 9 and 11 and in which discrete chips are used to implement the high-side and low-side power transistors of the corresponding single-phase or multi-phase power converter/voltage regulator.

In the case of a buck converter, the high-side power transistor chip 700 and the low-side power transistor chip 702 are electrically connected in a half-bridge configuration at a switch node which is electrically connected to an output inductor 706 of the single phase. The output inductor 706 provides a phase current to a load such as a processor or memory. One or more capacitors 708 which form part of the single phase may also be embedded in another layer 710 of the electrically insulating material 112 of the processor interposer 110. The output inductor 706 may be embedded in the processor interposer 110 or may be external to the processor interposer 110 as shown in FIG. 7. The capacitors 708 may also be external to the processor interposer 110, e.g., as shown in FIGS. 1 and 3. The driver and control circuitry for the power converter or voltage regulator partly implemented by the power module 124 shown in FIG. 7 also is external to the processor interposer 110, according to this embodiment.

Figure 8:
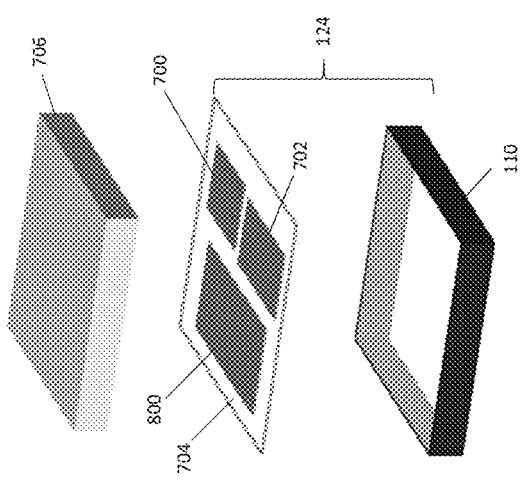

FIG. 8 shows an exploded side perspective view of the power device module 124, according to another embodiment. The embodiment shown in FIG. 8 is similar to the embodiment shown in FIG. 7 in that the power device module 124 implements a single phase of a power converter or voltage regulator that converts the intermediate voltage V_int output by the power converter 104 attached to the system board 102 to a voltage that is within the operating range of the processor 106 and which may or may not be below the voltage limit of the processor substrate 108. Different, however, the power device module 124 in FIG. 8 further includes circuitry 800 at least for driving the high-side power transistor chip 700 and the low-side power transistor chip 702 of the singe phase. The circuitry 800 may also include the control circuitry such as a pulse width modulator (PWM) and related circuits needed for controlling the single phase as a power converter or voltage regulator. The capacitors 708 which form part of the single phase are not shown as being embedded within the processor interposer 110 in this embodiment.

Figure 9:
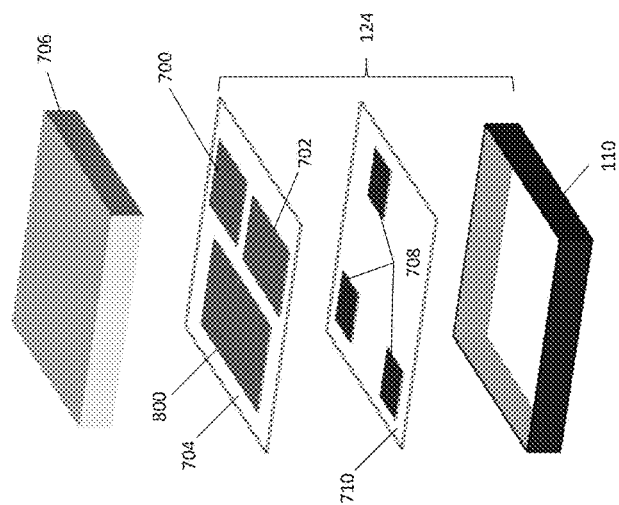
FIGS. 7 through 12 illustrate respective exploded side perspective views of additional embodiments of a power device module embedded in a processor interposer.

FIG. 9 shows an exploded side perspective view of the power device module 124, according to another embodiment. The embodiment shown in FIG. 9 is similar to the embodiment shown in FIG. 8. Different, however, the capacitors 708 which form part of the single phase are embedded within the processor interposer 110 in FIG. 9.

Figure 10:
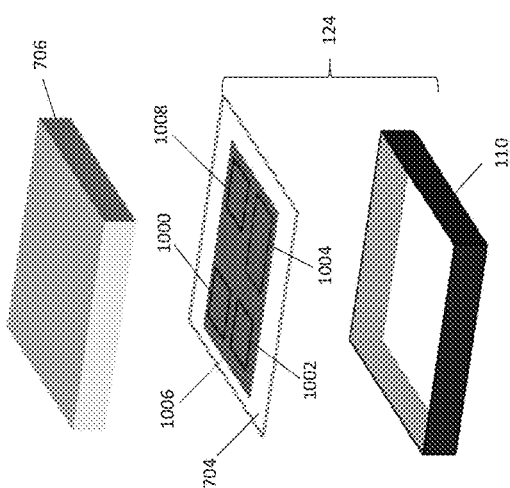

FIG. 10 shows an exploded side perspective view of the power device module 124, according to another embodiment. According to this embodiment, the high-side power transistor 1000, low-side power transistor 1002 and driver and/or control circuitry 1004 that form a single phase power converter or voltage regulator that converts the intermediate voltage V_int output by the power converter 104 attached to the system board 102 to a voltage that is within the operating range of the processor 106 are integrated in the same die 1006. The capacitance 706 for the single phase may also be integrated in the same die 1006 that includes the high-side power transistor 1000, low-side power transistor 1002 and driver and/or control circuitry 1004. If the circuitry 1004 includes both the driver and control circuitry for implementing a single-phase power converter or voltage regulator, the entire power converter/voltage regulator is embedded in the processor interposer 110 except for the output inductor 706, which may also be embedded in the processor interposer 110.

Figure 11:
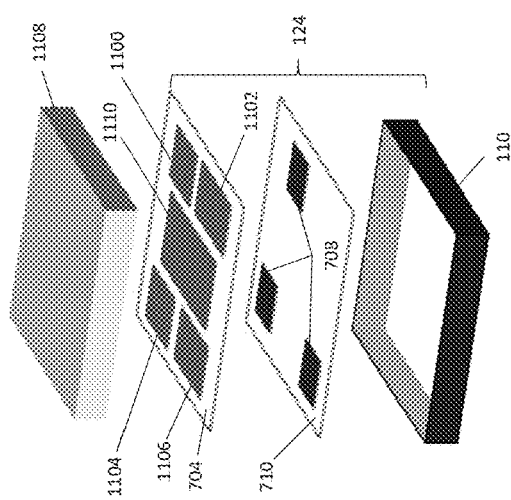

FIG. 11 shows an exploded side perspective view of the power device module 124, according to another embodiment. According to this embodiment, the power device module 124 implements a 2-phase power converter or voltage regulator that converts the intermediate voltage V_int output by the power converter 104 attached to the system board 102 to a voltage that is within the operating range of the processor 106 and which may or may not be below the voltage limit of the processor substrate 108. A first pair of high-side and low-side power transistor chips 1100, 1102 form a first phase of the 2-phase power converter or voltage regulator, and a second pair of high-side and low-side power transistor chips 1104, 1106 form a second phase of the 2-phase power converter or voltage regulator.

In the case of a buck converter, the first pair of high-side and low-side power transistor chips 1100, 1102 are electrically connected in a half-bridge configuration at a first switch node which is electrically connected to a first winding wound on a common core of a coupled inductor 1108 to form the first phase of the 2-phase power converter or voltage regulator. Likewise, the second pair of high-side and low-side power transistor chips 1104, 1106 are electrically connected in a half-bridge configuration at a second switch node which is electrically connected to a second winding wound on the common core of the coupled inductor 1108 to form the second phase of the 2-phase power converter or voltage regulator. Capacitors 708 which form part of the 2-phase power converter or voltage regulator may also be embedded in another layer 710 of the electrically insulating material 112 of the processor interposer 110.

The embodiment shown in FIG. 11 also includes circuitry 1110 at least for driving the first pair of high-side and low-side power transistor chips 1100, 1102 of the first phase and the second pair of high-side and low-side power transistor chips 1104, 1106 of the second phase. The circuitry 1110 may also include the control circuitry such as a pulse width modulator (PWM) and related circuits needed for controlling both phases as a 2-phase power converter or voltage regulator. The 2-phase implementation shown in FIG. 11 may be extended to implement an n-phase power converter or voltage regulator where n is a positive integer greater than or equal to 2.

Figure 12:
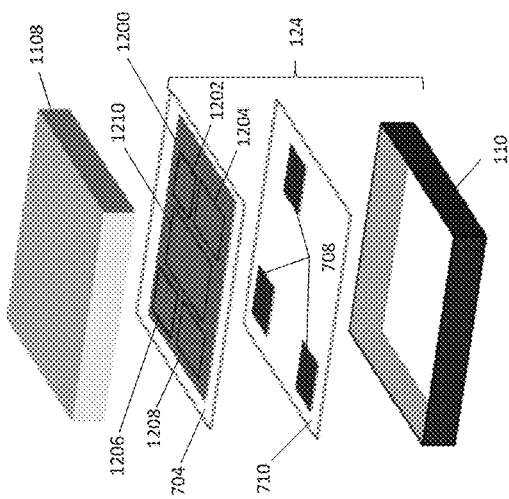

FIG. 12 shows an exploded side perspective view of the power device module 124, according to another embodiment. The embodiment shown in FIG. 12 is similar to the embodiment shown in FIG. 11. Different, however, the power transistors and related driver and/or control circuitry are monolithically in a single chip 1200 to yield a multi-phase power converter/voltage regulator that converts the intermediate voltage V_int output by the power converter 104 attached to the system board 102 to a voltage that is within the operating range of the processor 106 and which may or may not be below the voltage limit of the processor substrate 108. According to this embodiment, the first pair of high-side and low-side power transistors 1202, 1204 which implement the first phase of the power converter/voltage regulator, the second pair of high-side and low-side power transistors 1206, 1208 which implement the second phase of the power converter/voltage regulator, and the corresponding driver and/or control circuitry 1210 are integrated in the same die 1200. If the circuitry 1210 integrated in the die 1200 includes both the driver and control circuitry for implementing a multi-phase power converter or voltage regulator, the entire power converter/voltage regulator is embedded in the processor interposer 110 except for the coupled inductor 1108, which may also be embedded in the processor interposer 110. Instead of a coupled inductor 1108, each phase of the multi-phase power converter or voltage regulator may use a separate coupled inductor not wound on a common core and each of which may or may not be embedded in the processor interposer 110.

Although the present disclosure is not so limited, the following numbered examples demonstrate one or more aspects of the disclosure.

Example 1. An electronic system, comprising: a board; a power converter attached to the board and configured to convert an input voltage applied to the board to an intermediate voltage; a processor attached to a substrate; and an interposer through which the processor attached to the substrate is in electrical communication with the board, wherein the interposer comprises: an electrically insulating material having a first main side facing the substrate and a second main side facing the board; a plurality of electrically conductive structures embedded in the electrically insulating material and configured to provide an electrical interface between the substrate and the board, or between the substrate and a socket attached to the board and in which the interposer is seated; and a power device module embedded in the electrically insulating material and configured to convert the intermediate voltage to a voltage that is within an operating range of the processor and may or may not be below a voltage limit of the substrate.

Example 2. The electronic system of example 1, wherein the power device module comprises at least one power switch embedded in the electrically insulating material of the interposer.

Example 3. The electronic system of example 2, wherein the power device module further comprises a driver circuit embedded in the electrically insulating material of the interposer and configured to drive the at least one power switch.

Example 4. The electronic system of example 3, wherein the power device module further comprises a controller embedded in the electrically insulating material of the interposer and configured to control the driver circuit so as to implement a voltage regulator configured to convert the intermediate voltage to a voltage that is within the operating range of the processor and may or may not be below the voltage limit of the substrate.

Example 5. The electronic system of example claim 4, wherein the voltage regulator is a multi-phase voltage regulator, and wherein a pair of power switches coupled in a half-bridge configuration is embedded in the electrically insulating material of the interposer for each phase of the multi-phase voltage regulator.

Example 6. The electronic system of example 5, wherein the power device module further comprises one or more capacitors and an inductor embedded in the electrically insulating material of the interposer for each phase of the multi-phase voltage regulator.

Example 7. The electronic system of example 6, wherein the inductor for each phase of the multi-phase voltage regulator is a separate winding wound on a common core embedded in the electrically insulating material of the interposer.

Example 8. The electronic system of any of examples 4 through 7, wherein the first main side of the electrically insulating material of the interposer has the same length and width dimensions as a side of the substrate facing the interposer.

Example 9. The electronic system of any of examples 1 through 3, wherein the processor is configured to control the driver circuit of the power device module so as to implement a voltage regulator.

Example 10. The electronic system of example 9, wherein the electrical interface provided by the interposer includes a first terminal configured to receive a switching control signal from the processor through the substrate for controlling the driver circuit included in the power device module, and one or more second terminals configured to provide telemetry data from the power device module to the processor through the substrate.

Example 11. The electronic system of any of examples 1 through 3 and 9 through 10, wherein one or more capacitors and one or more inductors electrically connected to the power device module are attached to the first main side of the electrically insulating material outside a footprint allocated for the substrate.

Example 12. The electronic system of any of examples 1 through 11, wherein the power device module is vertically aligned with the processer, and wherein a primary current path between the board, the interposer, the substrate and the processor is a vertical path which includes the power device module.

Example 13. A processor interposer, comprising: an electrically insulating material having a first main side and a second main side opposite the first main side; a plurality of electrically conductive structures embedded in the electrically insulating material and configured to provide an electrical interface for a processor substrate at the first main side of the electrically insulating material and to provide electrical connections from the electrical interface to the second main side of the electrically insulating material; and a power device module embedded in the electrically insulating material and configured to convert a voltage provided at the second main side of the electrically insulating material and which exceeds a voltage limit of a processor designed substrate to a voltage that is below the voltage limit of the processor.

Example 14. The processor interposer of example 13, wherein the power device module comprises at least one power switch embedded in the electrically insulating material.

Example 15. The processor interposer of example 14, wherein the power device module further comprises a driver circuit embedded in the electrically insulating material and configured to drive the at least one power switch.

Example 16. The processor interposer of example 15, wherein the power device module further comprises a controller embedded in the electrically insulating material and configured to control the driver circuit so as to implement a voltage regulator.

Example 17. The processor interposer of example 16, wherein the voltage regulator is a multi-phase voltage regulator, and wherein a pair of power switches coupled in a half-bridge configuration is embedded in the electrically insulating material for each phase of the multi-phase voltage regulator.

Example 18. The processor interposer of example 17, wherein the power device module further comprises one or more capacitors and an inductor for each phase of the multi-phase voltage regulator embedded in the electrically insulating material.

Example 19. The processor interposer of example 18, wherein the inductor for each phase of the multi-phase voltage regulator is a separate winding wound on a common core embedded in the electrically insulating material.

Example 20. The processor interposer of any of examples 13 through 15, wherein the driver circuit of the power device module is configured to be controlled by a processor attached to the processor substrate so as to implement a voltage regulator.

Example 21. The processor interposer of example 20, wherein the electrical interface includes a first terminal configured to receive a switching control signal from the processor attached to the processor substrate for controlling the driver circuit included in the power device module, and one or more second terminals configured to provide telemetry data from the power device module to the processor attached to the processor substrate.

Example 22. The processor interposer of any of examples 13 through 15 and 20 through 21, wherein one or more capacitors and one or more inductors electrically connected to the power device module are attached to the first main side of the electrically insulating material outside a footprint allocated for the processor substrate.

Example 23. The processor interposer of example 22, wherein the power device module at least partially vertically overlaps with the one or more capacitors and/or the one or more inductors.

Example 24. The processor interposer of any of examples 13 through 23, wherein the electrically insulating material comprises a first layer in which the power device module is embedded and at least one additional layer formed on the first layer, wherein the power device module has at least one contact configured to receive the voltage provided at the second main side of the electrically insulating material, and wherein the plurality of electrically conductive structures embedded in the electrically insulating material includes distribution circuitry configured to carry the lower voltage provided by the power device module to the first main side of the electrically insulating material.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic system, comprising:
    a board;
    a power converter attached to the board and configured to convert an input voltage applied to the board to an intermediate voltage;
    a processor attached to a substrate; and
    an interposer through which the processor attached to the substrate is in electrical communication with the board, wherein the interposer comprises:
        an electrically insulating material having a first main side facing the substrate and a second main side facing the board;
        a plurality of electrically conductive structures embedded in the electrically insulating material and configured to provide an electrical interface between the substrate and the board, or between the substrate and a socket attached to the board and in which the interposer is seated; and
        a power device module embedded in the electrically insulating material and configured to convert the intermediate voltage to a voltage that is within an operating range of the processor,
        wherein the power device module comprises at least one power switch embedded in the electrically insulating material of the interposer,
        wherein the power device module further comprises a driver circuit embedded in the electrically insulating material of the interposer and configured to drive the at least one power switch.

2. The electronic system of claim 1, wherein the power device module further comprises a controller embedded in the electrically insulating material of the interposer and configured to control the driver circuit so as to implement a voltage regulator configured to convert the intermediate voltage to a voltage that is within the operating range of the processor.

3. The electronic system of claim 2, wherein the voltage regulator is a multi-phase voltage regulator, and wherein a pair of power switches coupled in a half-bridge configuration is embedded in the electrically insulating material of the interposer for each phase of the multi-phase voltage regulator.

4. The electronic system of claim 3, wherein the power device module further comprises one or more capacitors and an inductor embedded in the electrically insulating material of the interposer for each phase of the multi-phase voltage regulator.

5. The electronic system of claim 4, wherein the inductor for each phase of the multi-phase voltage regulator is a separate winding wound on a common core embedded in the electrically insulating material of the interposer.

6. The electronic system of claim 2, wherein the first main side of the electrically insulating material of the interposer has the same length and width dimensions as a side of the substrate facing the interposer.

7. The electronic system of claim 1, wherein the processor is configured to control the driver circuit of the power device module so as to implement a voltage regulator.

8. The electronic system of claim 7, wherein the electrical interface provided by the interposer includes a first terminal configured to receive a switching control signal from the processor through the substrate for controlling the driver circuit included in the power device module, and one or more second terminals configured to provide telemetry data from the power device module to the processor through the substrate.

9. The electronic system of claim 1, wherein one or more capacitors and one or more inductors electrically connected to the power device module are attached to the first main side of the electrically insulating material outside a footprint allocated for the substrate.

10. The electronic system of claim 1, wherein the power device module is vertically aligned with the processor, and wherein a primary current path between the board, the interposer, the substrate and the processor is a vertical path which includes the power device module.

11. A processor interposer, comprising:
an electrically insulating material having a first main side and a second main side opposite the first main side;
a plurality of electrically conductive structures embedded in the electrically insulating material and configured to provide an electrical interface for a processor substrate at the first main side of the electrically insulating material and to provide electrical connections from the electrical interface to the second main side of the electrically insulating material; and
a power device module embedded in the electrically insulating material and configured to convert a voltage provided at the second main side of the electrically insulating material to a lower voltage at the first main side of the electrically insulating material,
wherein the power device module comprises at least one power switch embedded in the electrically insulating material,
wherein the power device module further comprises a driver circuit embedded in the electrically insulating material and configured to drive the at least one power switch.

12. The processor interposer of claim 11, wherein the power device module further comprises a controller embedded in the electrically insulating material and configured to control the driver circuit so as to implement a voltage regulator.

13. The processor interposer of claim 12, wherein the voltage regulator is a multi-phase voltage regulator, and wherein a pair of power switches coupled in a half-bridge configuration is embedded in the electrically insulating material for each phase of the multi-phase voltage regulator.

14. The processor interposer of claim 13, wherein the power device module further comprises one or more capacitors and an inductor for each phase of the multi-phase voltage regulator embedded in the electrically insulating material.

15. The processor interposer of claim 14, wherein the inductor for each phase of the multi-phase voltage regulator is a separate winding wound on a common core embedded in the electrically insulating material.

16. The processor interposer of claim 11, wherein the driver circuit of the power device module is configured to be controlled by a processor attached to the processor substrate so as to implement a voltage regulator.

17. The processor interposer of claim 16, wherein the electrical interface includes a first terminal configured to receive a switching control signal from the processor attached to the processor substrate for controlling the driver circuit included in the power device module, and one or more second terminals configured to provide telemetry data from the power device module to the processor attached to the processor substrate.

18. The processor interposer of claim 11, wherein one or more capacitors and one or more inductors electrically connected to the power device module are attached to the first main side of the electrically insulating material outside a footprint allocated for the processor substrate.

19. The processor interposer of claim 18, wherein the power device module at least partially vertically overlaps with the one or more capacitors and/or the one or more inductors.

20. The processor interposer of claim 11, wherein the electrically insulating material comprises a first layer in which the power device module is embedded and at least one additional layer formed on the first layer, wherein the power device module has at least one contact configured to receive the voltage provided at the second main side of the electrically insulating material, and wherein the plurality of electrically conductive structures embedded in the electrically insulating material includes distribution circuitry configured to carry the lower voltage provided by the power device module to the first main side of the electrically insulating material.

21. A processor interposer, comprising:
an electrically insulating material having a first main side and a second main side opposite the first main side;
a plurality of electrically conductive structures embedded in the electrically insulating material and configured to provide an electrical interface for a processor substrate at the first main side of the electrically insulating material and to provide electrical connections from the electrical interface to the second main side of the electrically insulating material; and
a power device module embedded in the electrically insulating material and configured to convert a voltage provided at the second main side of the electrically insulating material to a lower voltage at the first main side of the electrically insulating material,
wherein the electrically insulating material comprises a first layer in which the power device module is embedded and at least one additional layer formed on the first layer,
wherein the power device module has at least one contact configured to receive the voltage provided at the second main side of the electrically insulating material,
wherein the plurality of electrically conductive structures embedded in the electrically insulating material includes distribution circuitry configured to carry the lower voltage provided by the power device module to the first main side of the electrically insulating material.

* * * * *